United States Patent
Krochmal et al.

(10) Patent No.: US 7,202,731 B2
(45) Date of Patent: Apr. 10, 2007

(54) VARIABLE DISTORTION LIMITER USING CLIP DETECT PREDICTOR

(75) Inventors: Andrew C. Krochmal, Plymouth, MI (US); John E. Whitecar, Plymouth, MI (US); David P. Stewart, Novi, MI (US)

(73) Assignee: Visteon Global Technologies, Inc., Van Buren Township, MI (US)

( * ) Notice: Subject to any disclaimer, the term of this patent is extended or adjusted under 35 U.S.C. 154(b) by 155 days.

(21) Appl. No.: 11/155,800

(22) Filed: Jun. 17, 2005

(65) Prior Publication Data

US 2006/0284675 A1 Dec. 21, 2006

(51) Int. Cl.
*G01R 19/00* (2006.01)

(52) U.S. Cl. ............................. 330/2; 330/149; 330/278

(58) Field of Classification Search ................... 330/2, 330/149, 278
See application file for complete search history.

(56) References Cited

U.S. PATENT DOCUMENTS

| | | | |
|---|---|---|---|
| 3,701,028 A | 10/1972 | Markevich | |
| 4,208,548 A | 6/1980 | Orban | |
| 4,912,424 A | 3/1990 | Nicola et al. | |
| 5,168,526 A | 12/1992 | Orban | |
| 5,255,324 A | 10/1993 | Brewer et al. | |
| 5,371,803 A | 12/1994 | Williamson, III | |
| 5,402,495 A | 3/1995 | Kim | |
| 5,430,409 A | 7/1995 | Buck et al. | |
| 5,442,316 A | 8/1995 | Buck et al. | |
| 5,453,716 A | 9/1995 | Person et al. | |
| 5,579,404 A | 11/1996 | Fielder et al. | |
| 6,577,737 B1 | 6/2003 | Krochmal et al. | |
| 6,718,165 B1 * | 4/2004 | Ha ........................... 455/234.2 |
| 6,760,452 B2 | 7/2004 | Lau et al. | |
| 6,914,987 B2 * | 7/2005 | Blind et al. ................... 381/13 |
| 6,956,430 B2 * | 10/2005 | De Poortere ................... 330/2 |
| 7,113,606 B2 * | 9/2006 | Botti et al. ................ 381/94.1 |
| 2002/0090096 A1 | 7/2002 | Blind et al. | |
| 2002/0150266 A1 | 10/2002 | Hinkle et al. | |
| 2004/0160278 A1 | 8/2004 | De Poortere | |
| 2004/0184621 A1 | 9/2004 | Andersen et al. | |

* cited by examiner

*Primary Examiner*—Patricia Nguyen
(74) *Attorney, Agent, or Firm*—Brinks Hofer Gilson & Lione

(57) ABSTRACT

A system and method for predicting and limiting distortion of an amplified signal is described. The system includes a variable total harmonic distortion ("THD") clipping predictor, a comparator in communication with the variable THD clipping predictor and a distortion limiter in communication with the comparator. As for the method, a reference power supply value, a maximum desired total harmonic distortion value and a preamplified signal value is provided. A THD output threshold value is calculated based on the reference power supply value and the maximum desired THD value and is then compared to the preamplified signal value. Depending on if the preamplified signal value is greater than or less than the THD output threshold value, the amplitude of the preamplified signal may be increased or decreased.

15 Claims, 1 Drawing Sheet

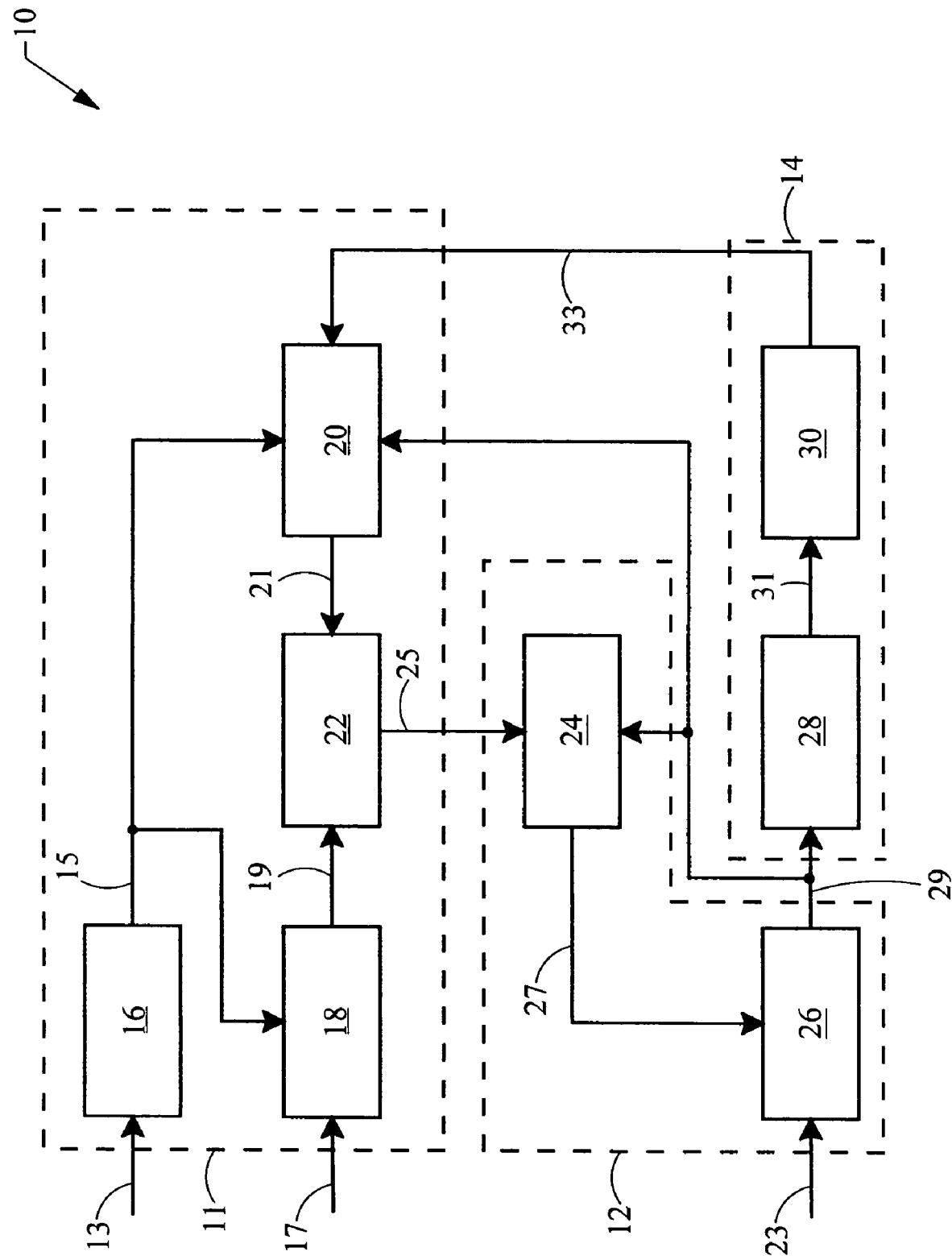

VARIABLE DISTORTION LIMITER USING CLIP DETECT PREDICTOR

BACKGROUND

1. Field of the Invention

The present invention generally relates to audio signal clipping and distortion limiting systems.

2. Description of the Known Technology

Automotive audio systems have an amplifier which amplifies a preamplified audio signal. However, the magnitude of the amplification of the preamplified audio signal is limited by the source voltage that powers the amplifier. If the amplifier is provided with a preamplified audio signal of an amplitude such that the magnitude of the amplified signal will exceed the voltage powering the amplifier, a clipped amplified signal will be generated by the amplifier. When clipping occurs, THD can be increased to an undesirable level.

Current solutions to this problem involve monitoring the output of the amplifier to determine if a clipped signal is generated. Once a clipped signal is detected, the preamplified signal is adjusted to limit the amount of THD induced by clipping. Current solutions have the drawback that the amplifiers used have a fixed THD threshold at which clipping is indicated.

Therefore, there exists a need for a solution that can determine if an amplifier will generate a clipped signal, based on a variable/selectable THD threshold and adjust the preamplified signal so that the THD will be limited below the variable/selectable THD threshold.

BRIEF SUMMARY OF THE INVENTION

In overcoming the drawbacks and limitations of the known technology, the present invention discloses a system and method for limiting distortion.

As to the method, a reference power supply value, a maximum desired total harmonic distortion value ("THD") and a preamplified signal value is provided. A THD output threshold value is calculated based on the reference power supply value and the maximum desired THD value. The THD output threshold value is then compared to the preamplified signal value. If the preamplified signal value is greater than the THD output threshold value, the amplitude of the preamplified signal will be decreased by a specified value. Conversely, if the preamplified signal value is less than the THD output threshold value, the amplitude of the preamplified signal is increased by a different specified value.

As to the system, the system includes a variable THD clipping predictor, a comparator in communication with the variable THD clipping predictor and a distortion limiter in communication with the comparator. An amplifier may be added to the system and is in communication with the distortion limiter.

The system may also have components for compensating and adjusting for gain. The system for compensating for gain includes a calibrator unit in communication with the distortion limiter and a gain compensation unit in communication with the calibrator, the comparator, and the variable THD clipping predictor.

Further objects, features and advantages of this invention will become readily apparent to those persons skilled in the art after a review of the following description, with reference to the drawings and claims that are appended to and form part of this specification.

BRIEF DESCRIPTION OF THE DRAWING

The FIGURE is a block diagram of a variable distortion limiter using clip detect predictor embodying the principles of the present invention.

DETAILED DESCRIPTION

Referring now to the FIGURE, the components of a variable distortion limiter using clip detect predictor are shown. The variable distortion limiter using clip detect predictor system 10 includes a microprocessor 11, a digital signal processor ("DSP") 12 and an amplifier 14.

The microprocessor 11 includes a filter 16 for filtering the supply voltage 13 of the amplifier 14. By way of example, the filter 16 uses a ten bit analog-to-digital converter that will convert the supply voltage 13 to a digital value, and filters the digital value in software. However, the filter 16 may be any device for filtering the supply voltage. For example, the filter 16 could be an analog low pass filtering device. In operation, the filter 16 will sample a plurality of values representing the supply voltage and average the plurality of values to obtain and output a reference supply voltage value 15 ("$V_{Ref}$") as measured in volts.

Further disposed within the microprocessor 11 is a variable THD clipping predictor 18. The variable THD clipping predictor 18 receives the reference supply voltage value 15 and a maximum desired THD value 17 ("$T_{Max}$") as measured as a percent and outputs a THD output threshold value 19 ("$T_{Threshold}$") as measured in millivolts. The maximum desired THD value 17 is an arbitrary value which may vary for different applications. The THD output threshold value 19 is calculated by using the reference supply voltage value 15 and the maximum desired THD value 17 and is based upon a mathematical model used for a specific amplifier. For example, the mathematical model used for a Philips TDA8566 amplifier is:

$$T_{Threshold} = -0.118(V_{Ref})^2 + 37.6(V_{Ref}) + 2356.3(T_{Max})^2 - 129.2(T_{Max}) + 83.7(rV_{Ref})(T_{Max}) - 86.4$$

Further included within the microprocessor 11 are a calibrator 20 and a gain compensator 22. The calibrator 20 accounts for component variation (e.g. gain). The calibrator 20 will output a calibration factor 21 that is calculated using the reference supply voltage value 15, a preamplified signal 29 and a fixed THD threshold exceeded value 33. The preamplified signal 29 is the signal outputted by the DSP 12 and to be amplified by the amplifier 14. Preferably, the fixed THD threshold exceeded value 33 is produced by the amplifier 14 in the event that the amplifier 14 detects a clipped signal. However, the fixed THD threshold exceeded value 33 may be detected by other means (for example, external test and measurement equipment).

The compensation unit 22 receives the calibration factor 21 from the calibrator 20 and the THD output threshold value 19 from the variable THD clipping predictor. The gain compensation unit 22 multiplies the calibration factor 21 and the THD output threshold value 19; the resulting product of which is a compensated THD output threshold value 25 which accounts for component variation. The compensated THD output threshold value 25 is the maximum amplitude that the preamplified signal 29 can have without exceeding the desired THD.

This compensated THD output threshold value 25 is provided to the DSP 12, which includes a comparator 24 and a distortion limiter 26. The distortion limiter 26 receives a raw audio signal 23 and generates the preamplified signal 29. The comparator 24 also receives the preamplified signal 29 and compares the compensated THD output threshold value 25 with the preamplified signal 29.

If the comparator 24 determines that the preamplified signal 29 is greater than the compensated THD output threshold value 25, the comparator 24 will generate a threshold exceeded value 27 sent to the distortion limiter 26. In the event the distortion limiter 26 receives the threshold exceeded value 27 from the comparator 24, the distortion limiter 26 will reduce the gain (i.e. "attack") of the preamplified signal 29 at a rate of 0.4 decibels per millisecond until the comparator 24 has determined that the preamplified signal 29 no longer exceeds the compensated THD output threshold 25.

In the event that the comparator 24 does not detect the threshold exceeded value 27, the distortion limiter 26 will increase the gain (i.e. "release") of the preamplified signal 29 at a rate of 0.02 decibels per millisecond until the gain reaches 0 decibels. However, it should be understood that rate of attack and/or release may vary depending on the application.

The preamplified signal 29 is also provided to the amplifier 14, which includes a signal amplifier 28 and a fixed THD clipping detector 30. The signal amplifier 28 amplifies the preamplified signal 29 and generates an amplified output signal 31. The fixed THD clipping detector 30 receives the amplified output signal 31 and determines if the amplified output signal 31 is a clipped signal. If the fixed THD clipping detector 30 determines that the amplified output signal 31 is a clipped signal, the fixed THD clipping detector 30 sends a fixed THD threshold exceeded value 33 to the calibrator 20.

As a person skilled in the art will readily appreciate, the above description is meant as an illustration of implementation of the principles this invention. This description is not intended to limit the scope or application of this invention in that the invention is susceptible to modification, variation and change, without departing from the spirit of this invention, as defined in the following claims.

The invention claimed is:

1. A method for predicting clipping and limiting distortion of an amplified signal, the method comprising the steps of:
   providing a reference supply voltage value ("$V_{Ref}$");
   providing an arbitrary maximum desired total harmonic distortion value ("THD") value ("$T_{Max}$");
   calculating a THD output threshold value ("$T_{Threshold}$") based on the reference power supply value and the maximum desired THD value;
   providing a preamplified signal value;
   comparing the preamplified signal value to the THD output threshold; and
   adjusting the amplitude of the preamplified signal value based on the comparison of the preamplified signal value and the THD output threshold.

2. The method of claim 1, wherein the adjusting step decreases the amplitude of the preamplified signal by a specified value if the preamplified signal value is greater than the THD output threshold.

3. The method of claim 2, wherein the adjusting step decreases the amplitude of the preamplified signal by about 0.4 decibels per millisecond.

4. The method of claim 1, wherein the adjusting step increases the amplitude of the preamplified signal by a specified value if the preamplified signal value is less than the THD output threshold.

5. The method of claim 4, wherein the adjusting step increases the amplitude of the preamplified signal by about 0.02 decibels per millisecond.

6. The method of claim 1 further comprising the step of calculating the reference supply voltage value by averaging a plurality of supply voltage values sampled from a power supply.

7. The method of claim 1, wherein the THD output threshold value is calculated using the formula: $T_{Threshold} = -0.118\ (V_{Ref})^2 + 37.6\ (V_{Ref}) + 2356.3\ (T_{Max})^2 - 129.2\ (T_{Max}) + 83.7\ (V_{Ref})\ (T_{Max}) - 86.4$.

8. The method of claim 1, further comprising the step of compensating the THD output threshold for gain.

9. The method of claim 8, wherein the compensating step includes the steps of calculating a calibration factor using the reference power supply value, the preamplified output signal and fixed THD threshold exceeded value.

10. The method of claim 9 wherein the compensating step includes the step of multiplying the calibration factor by the THD output threshold value to determine a compensated THD output threshold value.

11. A system for predicting clipping and limiting distortion of an amplified signal, the system comprising:
    a variable THD clipping predictor configured to receive a reference supply voltage value and a maximum desired THD value;
    a comparator in communication with the variable THD clipping predictor and configured to receive a THD output threshold value therefrom; and
    a distortion limiter in communication with the comparator and configured to receive a variable THD output threshold exceeded value from the comparator and a raw audio signal and configured to generate a preamplified signal based on the variable THD output threshold value and the raw audio signal.

12. The system of claim 11, further comprising a signal amplifier in communication with the distortion limiter and configured to receive the preamplified signal therefrom.

13. The system of claim 11, wherein the reference supply voltage value is a filtered reference supply voltage value provided by a filter.

14. The system of claim 11, further comprising a gain compensation unit in communication with the variable THD clipping predictor and the comparator and configured to receive the THD output threshold value from the variable THD clipping predictor and configured to send a compensated THD output threshold value to the comparator.

15. The system of claim 14, further comprising a calibrator in communication with a reference supply voltage filter, distortion limiter, gain compensation unit and a fixed THD clipping detector and configured to receive the filtered reference supply voltage from the supply voltage filter, preamplified signal from the distortion limiter and the fixed THD clipping detector value from a fixed THD clipping detector and send a calibration factor to the gain compensation unit.

* * * * *